(12) United States Patent
Yu et al.

(10) Patent No.: US 8,313,889 B2
(45) Date of Patent: Nov. 20, 2012

(54) DOUBLE PATTERNING METHOD USING METALLIC COMPOUND MASK LAYER

(75) Inventors: Vincent Yu, Taichung County (TW); Chih-Yang Yeh, Jhubei (TW); Hung Chang Hsieh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 301 days.

(21) Appl. No.: 12/752,281

(22) Filed: Apr. 1, 2010

(65) Prior Publication Data

US 2010/0279234 A1 Nov. 4, 2010

Related U.S. Application Data

(60) Provisional application No. 61/165,801, filed on Apr. 1, 2009.

(51) Int. Cl.
G03F 7/26 (2006.01)
(52) U.S. Cl. .................. 430/313; 430/314; 430/316
(58) Field of Classification Search .................. 430/313
See application file for complete search history.

(56) References Cited

U.S. PATENT DOCUMENTS 8,048,764 B2 * 11/2011 Huang et al. ............... 438/425
2010/0264500 A1 * 10/2010 Zhu .............................. 257/421

* cited by examiner

Primary Examiner — Kathleen Duda
(74) Attorney, Agent, or Firm — Lowe Hauptman Ham & Berner, LLP

(57) ABSTRACT

A hard mask layer and a developable bottom anti-reflective coating (dBARC) layer are formed over a dielectric layer of a substrate. A first photosensitive layer is formed above the dBARC layer, exposed, and developed to form a first pattern. The dBARC layer is developed. The first pattern is etched into the hard mask layer to form a first pattern of openings in the hard mask layer. Following removal of the first photosensitive layer, a second photosensitive layer is formed within the first pattern of openings. The second photosensitive layer is exposed and developed to form a second pattern. The dBARC layer is developed. The second pattern is etched into the hard mask layer to form a second pattern of openings in the hard mask layer. Following the removal of the second photosensitive layer and the dBARC layer, the first and the second patterns are etched into the dielectric layer.

20 Claims, 5 Drawing Sheets

DOUBLE PATTERNING METHOD USING METALLIC COMPOUND MASK LAYER

CROSS-REFERENCE TO RELATED APPLICATIONS

The present application claims priority of U.S. Provisional Patent Application Ser. No. 61/165,801 filed on Apr. 1, 2009, which is incorporated herein by reference in its entirety.

BACKGROUND

The present invention relates generally to a method of manufacturing a semiconductor device, and more particularly, to a double patterning method.

Semiconductor technologies are continually progressing to smaller feature sizes, down to 65 nanometers, 45 nanometers, and beyond. A patterned photoresist layer used to produce such small feature sizes typically has a high aspect ratio. Maintaining a desired critical dimension (CD) can be very difficult for various reasons. For example, because resist materials are susceptible to the etching process, they may suffer from pattern collapse and CD degradation during a photolithography patterning process. When double patterning techniques are utilized, additional issues may be brought out, such as round corners, resist pattern collapse, etching resistance, poor topography, exposure focusing errors, high manufacturing costs, and low throughput.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

Figure 1:
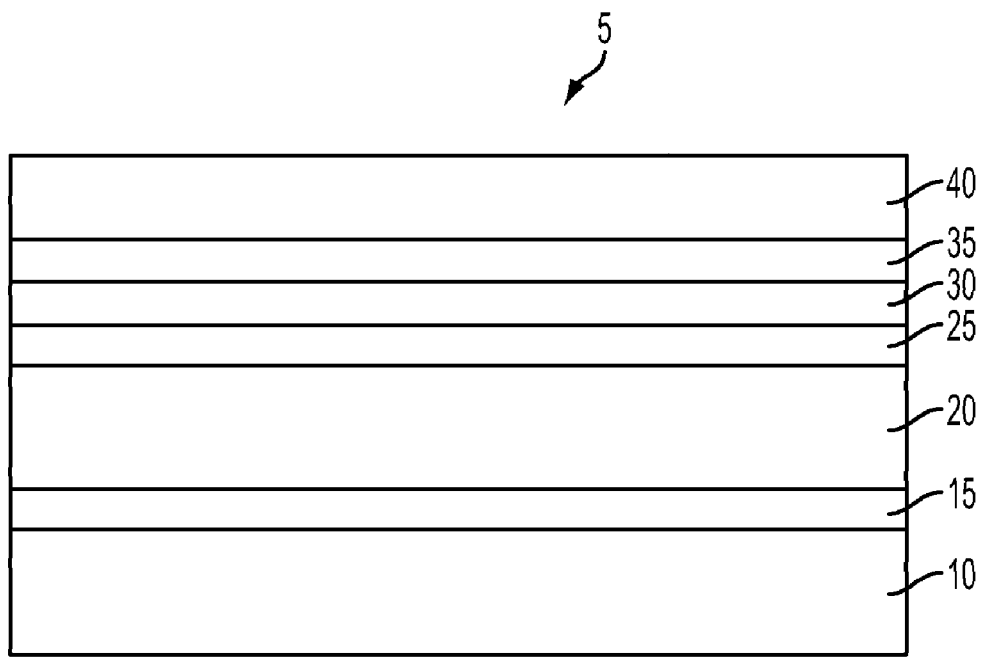
FIGS. 1-9 are cross-sectional views showing one embodiment of a semiconductor device during various fabrication stages of a double patterning method.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 8:
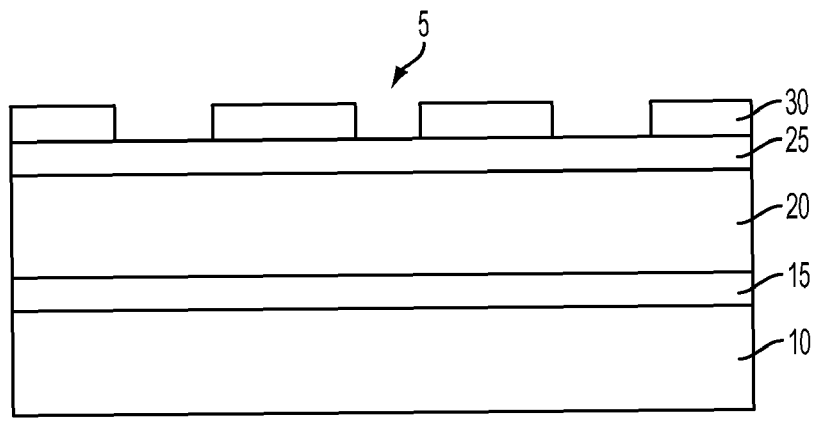
Figure 9:
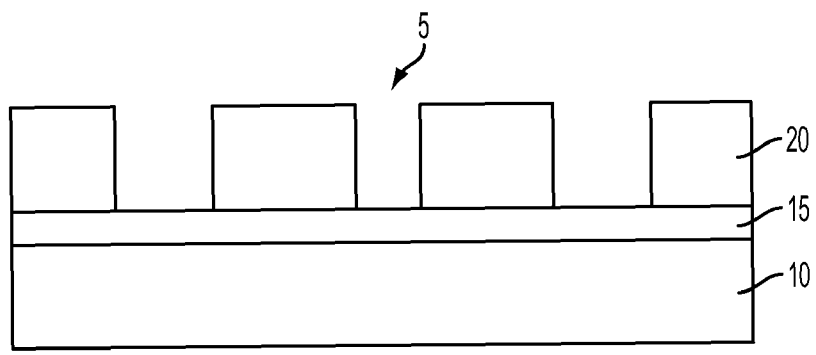
Figure 10:
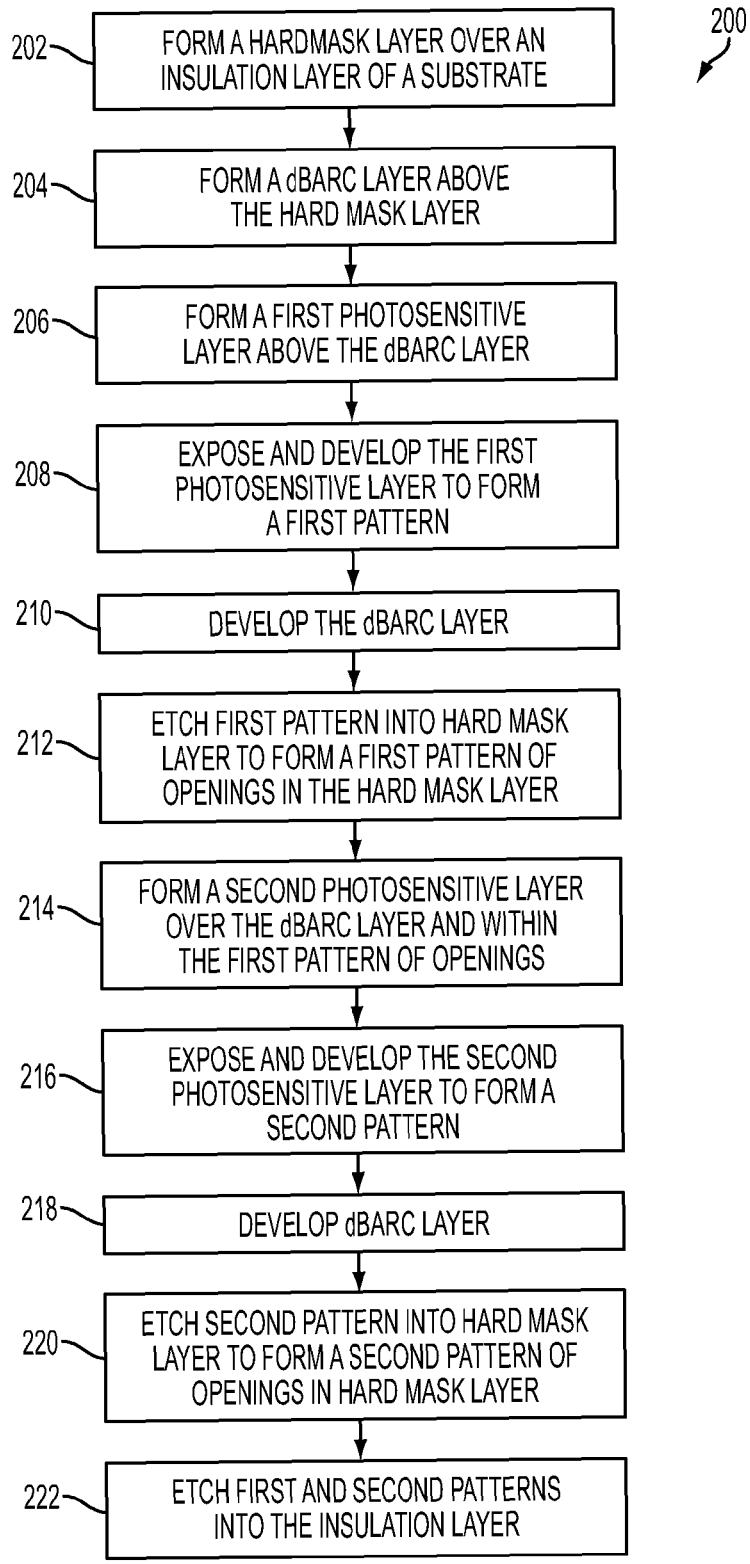
FIG. 10 is a flowchart showing one embodiment of a double patterning method.

FIGS. 1-9 are cross-sectional views showing one embodiment of a semiconductor device 5 during various fabrication stages of a double patterning method. FIG. 10 is a flowchart of one embodiment of a double patterning semiconductor device 5 made thereby.

FIG. 1 shows a semiconductor device 5 having a silicon substrate 10. The substrate 10 may alternatively be made of some other suitable semiconductor material, including Ge, SiGe, or GaAs. Further, the substrate 10 may alternatively be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. Alternatively, the substrate 10 may be a non-semiconductor material such as a glass substrate for thin-film transistor liquid crystal display (TFT-LCD) devices, or fused quartz or calcium fluoride for a photomask (mask or reticle). The substrate 10 may include various doped regions, dielectric features, and multilevel interconnects. In one embodiment, the substrate 10 includes various doped features for various microelectronic components such as complementary metal-oxide-semiconductor field-effect transistors (CMOSFETs), imaging sensors, memory cells, and/or capacitive elements. In another embodiment, the substrate 10 includes conductive material features and dielectric material features configured for coupling and isolating various microelectronic components, respectively. In another embodiment, the substrate 10 includes one or more material layers formed thereon.

An optional etch stop layer 15 is formed on the substrate 10. Etch stop layer 15 prevents substrate 10 from being damaged by a subsequent etching step and may simultaneously prevent substrate 10 from being oxidized by exposure to an oxygen containing environment. Etch stop layer 15 may be formed by chemical vapor deposition using a suitable etch stop material such as, for example, silicon nitride (SiN) or silicon oxynitride (SiON). In one embodiment of the present invention, etch stop layer 15 includes a silicon-carbide based material. Etch stop layer 15 has a thickness suitable to function as a stop layer to protect the underlying substrate 10 from damage and the thickness varies according to the process node in which the semiconductor device 5 is being manufactured.

An insulating layer or dielectric layer 20 is formed over the etch stop layer 15. The dielectric layer 20 may have a thickness ranging between about 600 angstroms and about 2,000 angstroms in one example. It is understood by those skilled in the art that the thickness of dielectric layer 20 is dependent upon the process node. An exemplary node uses silicon oxide and/or low dielectric-constant (low-k) dielectric material with a dielectric constant being less than about 4. For example, the low-k dielectric material may be a material selected from the group consisting of fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK™ (Dow Chemical, Midland, Mich.), polyimide, and/or other proper porous polymeric materials. The dielectric layer 20 may be formed by a suitable process including spin-on coating or chemical vapor deposition (CVD).

Formed over the dielectric layer 20 is an optional first liner layer 25. In one example, the first liner layer 25 may be an anti-reflective coating (ARC) layer. The first liner layer 25 is commonly applied between the dielectric layer and the photoresist to reduce undesirable reflections during a photolithographic process. First liner layer 25 may be formed of inorganic materials such as for example SiON, SiOC, SiN, TaN or any of various other suitable materials that may be used as anti-reflective coatings. First liner layer 25 may be formed over the dielectric layer 20 by a plasma enhanced CVD process, for example, low pressure CVD (LPCVD), to a thickness of about 200 angstroms to about 550 angstroms. However, it is understood by those skilled in the art that the thickness of the first liner layer 25 varies according to the process node in which the semiconductor device 5 is being manufactured.

Still referring to FIG. 1, a hard mask layer 30 is formed over the first liner layer 25. The hard mask layer 30 functions as a hard mask during a later etching process for patterning the dielectric layer 20 and/or the substrate 10. Hard mask layer 30 typically comprises a metallic compound or barrier metal, such as for example silicon nitride (SiN) and silicon carbide (SiC) and is formed by a suitable process such as spin-on coating or chemical vapor deposition (CVD). Silicon nitride etches at a much slower rate than the dielectric material of the dielectric layer 20, thus effectively stopping the etch process. In other embodiments, the hard mask layer 30 includes hafnium dioxide ($HfO_2$), zirconium dioxide ($ZrO_2$), titanium dioxide ($TiO_2$), and alkyl derivatives cross-linked with a transition metal compound. It is understood by one skilled in the art that the hard mask layer 30 has a suitable thickness to function as a stop layer. The hard mask layer 30 may have a thickness ranging between about 50 angstroms and about 200 angstroms in one example.

Additionally, a second liner layer 35 may be formed on the hard mask layer 30 for reducing reflection during lithography exposing processes. In one example, the second liner layer 35 includes a developable bottom anti-reflective coating (dBARC) material. The dBARC material can be of a photosensitive or a developer sensitive type material. The dBARC layer is used, because both the dBARC layer and a later-to-be formed photoresist layer can be opened simultaneously in a later development process. With a conventional BARC layer, an additional plasma etch process may be needed to transfer patterns from the photoresist to the BARC layer. In another embodiment, the second liner layer 35 has a thickness ranging from about 300 angstroms to about 900 angstroms. However, the thickness of the second liner layer 35 varies according to the process node in which the semiconductor device 5 is being manufactured. The second liner layer 35 may be formed by a spin-on coating technique or chemical vapor deposition (CVD).

Figure 2:
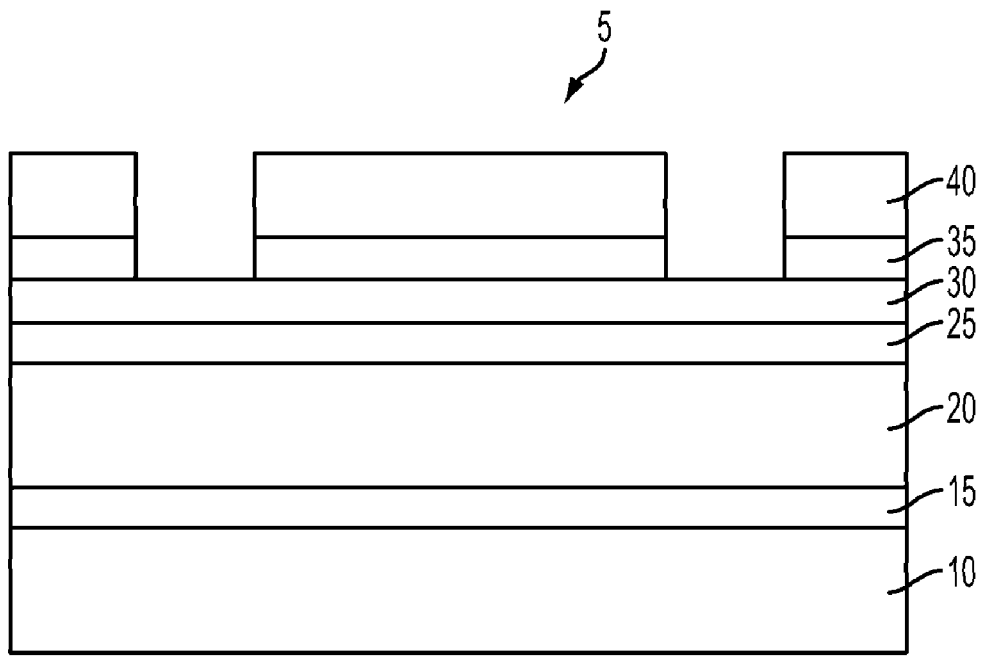

A first photoresist layer 40 is formed on the substrate 10 as shown in FIG. 1 and then patterned by a lithography process to form first resist pattern 40 as illustrated in FIG. 2. The first resist pattern 40 includes a plurality of first resist features and a plurality of openings defined by the first resist features, such that portions of the underlying second liner layer 35 within the openings are exposed. The openings of the first resist pattern 40 are configured according to a predetermined pattern. In one example, the first resist pattern 40 includes various lines configured according to the IC features defined on a mask. The first resist pattern 40 may have a thickness ranging between about 700 angstroms to about 1,200 angstroms. The photoresist material of the first resist pattern 40 can be a positive-type resist or a negative-type resist. For advanced semiconductor patterning using an extreme ultraviolet (EUV) radiation beam, the first resist pattern 40 may use a chemical amplification (CA) resist. The first resist pattern 40 may include acid molecular or radiation-sensitive acid generator, such that acid can be generated when a radiation beam is applied.

The first resist pattern 40 is formed by a lithography process that may include conventional processing steps of resist coating, soft baking, mask alignment, exposing, and post-exposure baking (PEB). For illustration, the exposing process may be carried out by exposing the semiconductor device 5 under a radiation beam through a mask having a predetermined pattern (or a reversed pattern). The radiation Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, electron-beam writing, ion-beam writing, and molecular imprint techniques.

Figure 3:
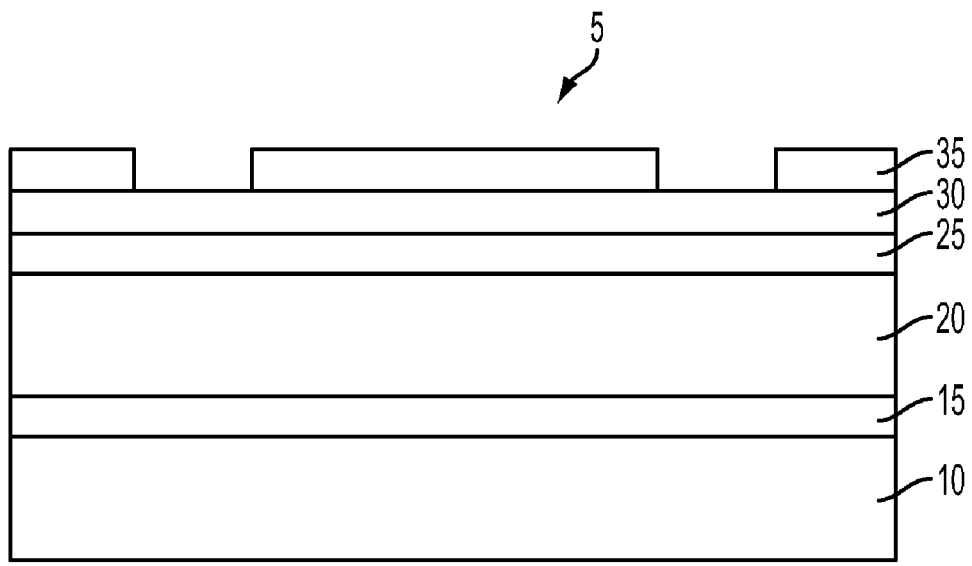
Figure 4:
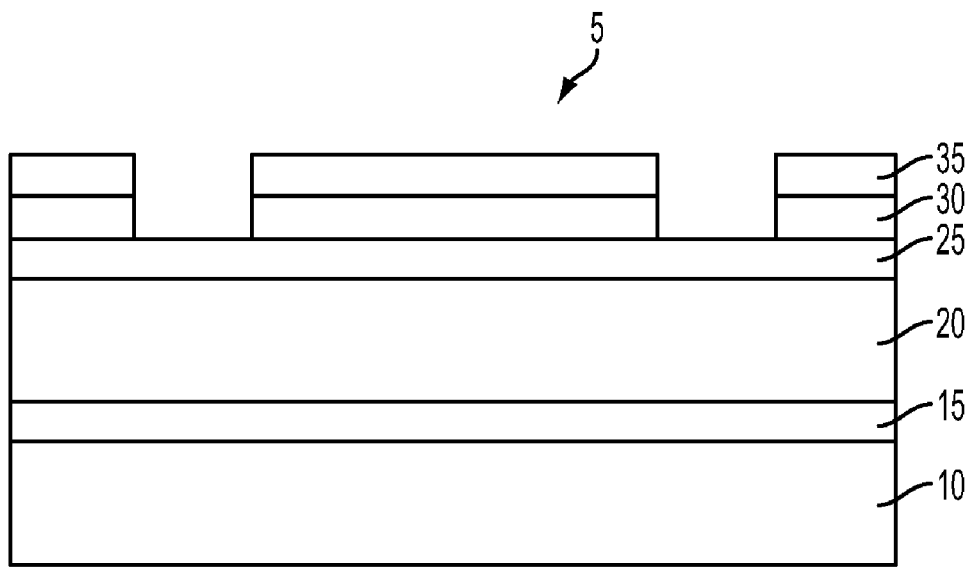

Following the patterning step, the first resist pattern 40 is developed as well as the second liner layer 35 by a conventional developer solution thereby exposing portions of the hard mask layer 30, as shown in FIG. 2. The first resist pattern 40 may be subject to a hardening (curing) process and may include thermal curing. Alternatively, the curing process may include ultraviolet (UV) curing, ion implant bombardment, e-beam treatment, or combinations thereof. As shown in FIG. 3, a resist ashing step may then be used to remove the first resist pattern 40. Using the openings defined by the first resist pattern 40 and the second liner layer 35, portions of the hard mask layer 30 is etched away by a mild acid solution to expose portions of the first liner layer 25, as illustrated in FIG. 4. The mild acid solution etches away the hard mask layer 30 but does not substantially etch the second liner layer 35. The etch process may include a wet etch process and in one embodiment, the etching process may implement a chemical comprising an organic acid, such as for example, acetic acid, formic acid, and citric acid. In another embodiment, the chemical may comprise an inorganic acid, such as for example, hydrochloric acid, phosphoric acid, and sulfuric acid. Due to the inorganic acid's strong acidity, one skilled in the art understands that the acidity can be modulated by dilution of the acid. It is also to be understood that the etch chemical that is selected will depend on the type of the metallic compound in the hard mask layer 30 that is to be etched as well as other factors such as etch selectivity and etch rate.

Figure 5:
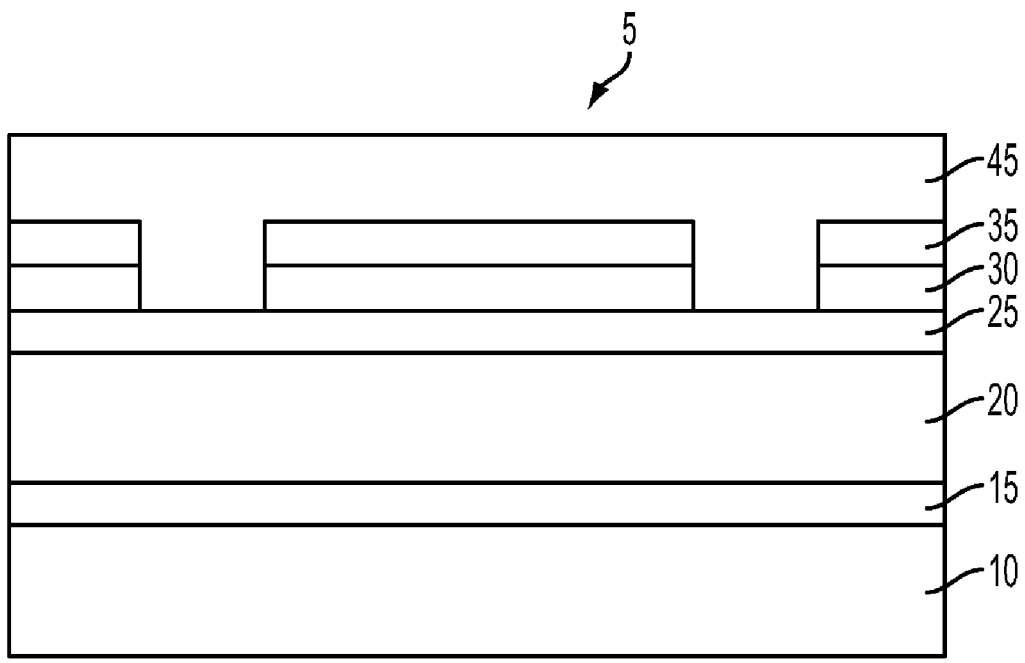
Figure 6:
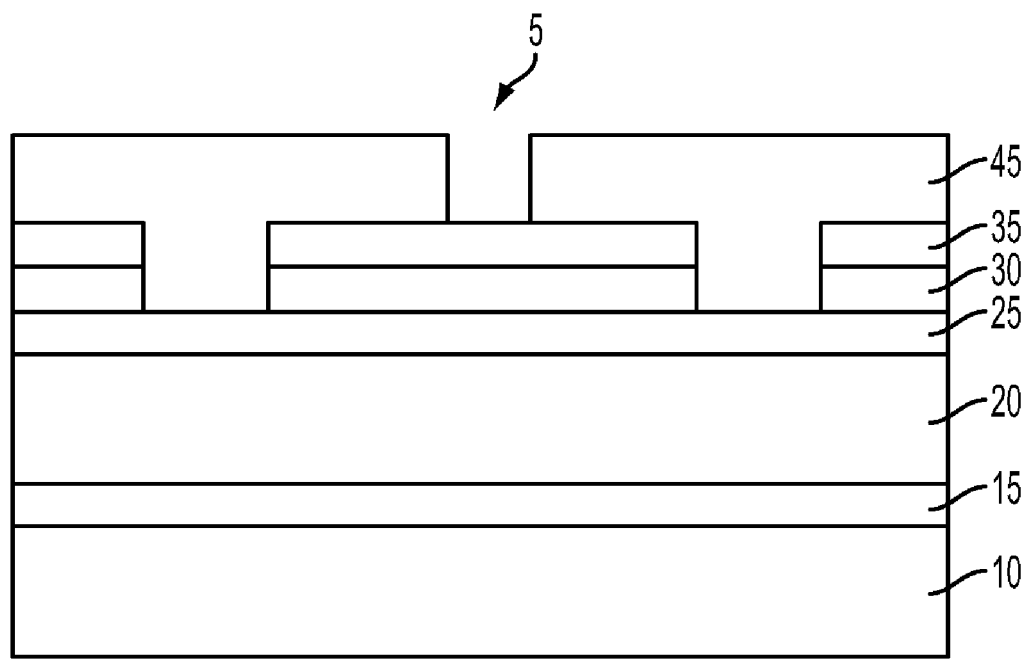

Referring now to FIG. 5, a second photoresist layer 45 is formed on the substrate 10 by a second lithography process. The second photoresist layer 45 is formed on the second liner layer 35 and in the openings of the hard mask layer 30 and then the second photoresist layer 45 is patterned to form second resist pattern 45, as shown in FIG. 6. Similarly, the second resist pattern 45 includes a plurality of second resist features and a plurality of openings defined by the second resist features. The second resist features are configured according to another predetermined IC structure positioned such that one of the second resist features is interposed between two adjacent features of the first resist pattern. Similarly, two adjacent features of the second resist pattern are interposed by one of the first resist features. The second resist pattern 45 is configured relative to the first resist pattern 40 so as to utilize a double patterning structure. The second resist pattern 45 may be substantially similar to the first resist pattern 40, in terms of formation and composition. The second resist pattern 45 may have a thickness substantially similar to that of the first resist pattern 40. In one embodiment, the resist material of the second resist pattern 45 is substantially similar to those of the first resist pattern 40. For example, the second resist pattern 45 may use a chemical amplification resist. The second lithography process of forming the second resist pattern 45 may be substantially similar to the first lithography process of forming the first resist pattern 40. For example, the lithography process may include steps of resist coating, soft baking, mask alignment, exposing, post-exposure baking, developing, and hard baking.

Figure 7:
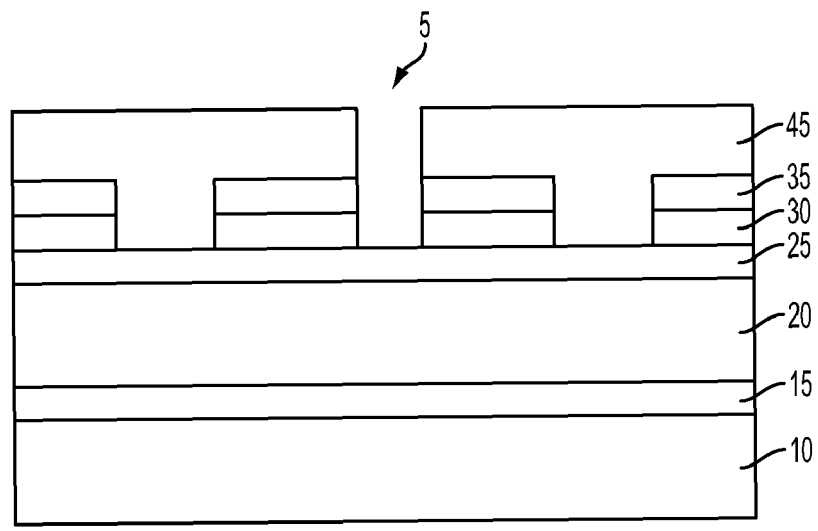

Following the patterning step, the second liner layer 35 is developed by a developer solution thereby exposing portions of the hard mask layer 30. Using the openings defined by the second resist pattern 45 and the second liner layer 35, portions of the hard mask layer 30 is etched away by a mild acid solution to expose portions of the first liner layer 25, as illustrated in FIG. 7. The mild acid solution etches away the hard mask layer 30 but does not substantially etch the second liner layer 35. The etch process may include a wet etch process and in one embodiment, the etching process may implement a chemical comprising an organic acid, such as for example, acetic acid, formic acid, and citric acid. In another embodiment, the chemical may comprise an inorganic acid, such as for example, hydrochloric acid, phosphoric acid, and sulfuric acid. Due to the inorganic acid's strong acidity, one skilled in the art understands that the acidity can be modulated by dilution of the acid. It is also to be understood that the etch chemical that is selected will depend on the type of the metallic compound in the hard mask layer 30 that is to be etched as well as other factors such as etch selectivity and etch rate.

In FIG. 8, a resist ashing step may be used to remove both the second resist pattern 45 and the second liner layer 35. As shown in FIG. 9, both the first and second patterns of the first and second resist patterns, respectively, are etched in the plasma etching process, for example.

FIG. 10 is a flowchart showing a double patterning method according to one embodiment of the present invention. The method 200 begins at step 202 by forming a hardmask layer over an insulation layer of a substrate. At step 204, a dBARC layer is formed above the hard mask layer. At step 206, a first photosensitive layer is formed above the dBARC layer. At step 208, the first photosensitive layer is exposed and developed to form a first pattern in the first photosensitive layer. At step 210, the dBARC layer is developed. At step 212, the first pattern is etched into the hard mask layer to form a first pattern of openings in the hard mask layer. At step 214, a second photosensitive layer is formed over the dBARC layer and within the first pattern of openings in the hard mask layer. At step 216, the second photosensitive layer is exposed and developed to form a second pattern in the second photosensitive layer. At step 218, the dBARC layer is developed again. At step 220, the second pattern is etched into the hard mask layer to form a second pattern of openings in the hard mask layer. At step 222, the first and second patterns are etched into the insulation layer.

The method described above with reference to FIGS. 1 to 9 provides a double patterning process constructed according to various aspects of the present disclosure. This method implements double exposures to the underlying layers, therefore reducing the manufacturing cost and increasing the throughput. Other advantages may be further realized. For example, since the mask layer 30 is used as a hard mask to etch the underlying layers or substrate, the disclosed method is capable of etching a thicker film because the mask layer 30 comprising a metallic compound can be properly chosen with higher etching resistance.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming a double patterning structure, the method comprising:
    forming a hard mask layer over a substrate;
    forming a developable bottom anti-reflective coating (dBARC) layer above the hard mask layer;
    forming a first photosensitive layer above the dBARC layer;
    exposing the first photosensitive layer;
    developing the first photosensitive layer to form a first pattern and developing the dBARC layer; and
    etching the first pattern into the hard mask layer to form a first pattern of openings in the hard mask layer, the hard mask layer being etched with a mild acid solution.

2. The method of claim 1, wherein the hard mask layer comprises a material selected from the group consisting of silicon nitride (SiN), silicon carbide (SiC), hafnium dioxide (HfO2), zirconium dioxide (ZrO2), titanium dioxide (TiO2), alkyl derivatives cross-linked with a transition metal compound, and combinations thereof.

3. The method of claim 1, wherein the forming the hard mask layer includes forming the hard mask layer by physical vapor deposition (PVD).

4. The method of claim 1, wherein the hard mask layer is etched by wet chemistry etching.

5. The method of claim 1, wherein the mild acid solution comprises a solution selected from the group consisting of acetic acid, formic acid, citric acid, hydrochloric acid, phosphoric acid, and sulfuric acid.

6. The method of claim 1, wherein the etching of the hard mask layer comprises implementing an etchant selected from the group consisting of an organic acid group, an inorganic acid group, and combinations thereof.

7. The method of claim 1, further comprising:
    removing the first photosensitive layer;
    forming a second photosensitive layer over the dBARC layer and within the first pattern of openings in the hard mask layer;
    exposing the second photosensitive layer; and
    developing the second photosensitive layer to form a second pattern and developing the dBARC layer.

8. The method of claim 7, further comprising etching the second pattern into the hard mask layer to form a second pattern of openings in the hard mask layer, the hard mask layer being etched with a mild acid solution.

9. The method of claim 8, wherein the mild acid solution for etching the second pattern into the hard mask layer comprises a solution selected from the group consisting of acetic acid, formic acid, citric acid, hydrochloric acid, phosphoric acid, and sulfuric acid.

10. The method of claim 8, further comprising removing the second photosensitive layer and the dBARC layer and etching the first pattern and the second pattern into the dielectric layer.

11. The method of claim 1, further comprising forming an etch stop layer (ESL) over the substrate before the forming of the hard mask layer.

12. The method of claim 11, further comprising forming a dielectric layer above the etch stop layer before the forming of the hard mask layer.

13. The method of claim 12, further comprising forming an inorganic anti-reflective coating (ARC) layer over the dielectric layer before the forming of the hard mask layer.

14. A method of forming a double patterning structure, the method comprising:
    providing a substrate with an etch stop layer formed thereabove;
    forming a dielectric layer above the etch stop layer;
    forming a hard mask layer above the dielectric layer;
    forming a developable bottom anti-reflective coating (dBARC) layer above the hard mask layer;

forming a first photosensitive layer above the dBARC layer;

exposing the first photosensitive layer;

developing the first photosensitive layer to form a first pattern and developing the dBARC layer; and etching the first pattern into the hard mask layer to form a first pattern of openings in the hard mask layer, the hard mask layer being etched with a mild acid solution.

15. The method of claim 14, wherein the hard mask layer comprises a material selected from the group consisting of silicon nitride (SiN), silicon carbide (SiC), hafnium dioxide ($HfO_2$), zirconium dioxide ($ZrO_2$), titanium dioxide ($TiO_2$), alkyl derivatives cross-linked with a transition metal compound, and combinations thereof.

16. The method of claim 14, wherein the hard mask layer is etched by wet chemistry etching.

17. The method of claim 14, wherein the mild acid solution comprises a solution selected from the group consisting of acetic acid, formic acid, citric acid, hydrochloric acid, phosphoric acid, and sulfuric acid.

18. The method of claim 14, further comprising forming an inorganic anti-reflective coating (ARC) layer over the dielectric layer before the forming of the hard mask layer.

19. The method of claim 14, further comprising:

removing the first photosensitive layer; forming a second photosensitive layer over the dBARC layer and within the first pattern of openings in the hard mask layer;

exposing the second photosensitive layer;

developing the second photosensitive layer to form a second pattern and developing the dBARC layer;

removing the second photosensitive layer and the dBARC layer; and etching the first pattern and the second pattern into the dielectric layer.

20. The method of claim 19, wherein the mild acid solution for etching the second pattern into the hard mask layer comprises a solution selected from the group consisting of acetic acid, formic acid, citric acid, hydrochloric acid, phosphoric acid, and sulfuric acid.

* * * * *